(12) United States Patent
Takizawa et al.

(10) Patent No.: US 11,606,888 B2
(45) Date of Patent: *Mar. 14, 2023

(54) CIRCUIT MODULE

(71) Applicant: TDK CORPORATION, Tokyo (JP)

(72) Inventors: Shuichi Takizawa, Tokyo (JP);
Hironori Sato, Tokyo (JP); Atsushi Yoshino, Tokyo (JP); Hideki Kachi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/352,982

(22) Filed: Jun. 21, 2021

(65) Prior Publication Data

US 2021/0315137 A1    Oct. 7, 2021

Related U.S. Application Data

(63) Continuation of application No. 16/284,231, filed on Feb. 25, 2019, now Pat. No. 11,076,513.

(30) Foreign Application Priority Data

Feb. 27, 2018   (JP) .............................. JP2018-033425

(51) Int. Cl.
*H05K 5/06* (2006.01)
*H05K 9/00* (2006.01)
*H05K 1/18* (2006.01)

(52) U.S. Cl.
CPC ........... *H05K 9/0045* (2013.01); *H05K 1/181* (2013.01); *H05K 5/065* (2013.01)

(58) Field of Classification Search
CPC ...... H05K 9/0045; H05K 5/065; H05K 1/181; H05K 2201/10015; H05K 2201/1003;
(Continued)

(56) References Cited

U.S. PATENT DOCUMENTS 6,184,064 B1   2/2001   Jiang et al.
6,400,014 B1   6/2002   Huang et al.
(Continued)

FOREIGN PATENT DOCUMENTS

JP   H6-163755 A    6/1994
JP   H11-330314 A   11/1999
(Continued)

*Primary Examiner* — Hung S. Bui
*Assistant Examiner* — Sagar Shrestha
(74) *Attorney, Agent, or Firm* — Oliff PLC

(57) ABSTRACT

A circuit module 2 comprises: a wiring structure 4; at least one electronic component 6a, 6b arranged on the upper surface of the wiring structure 4; an insulating resin layer 8 which is provided on the upper surface of the wiring structure 4 and in which at least one electronic component 6a, 6b is embedded; and a metal layer 10 provided on the upper surface of the insulating resin layer 8. The surface roughness of the portion S1 directly above each electronic component on the upper surface of the insulating resin layer 8 is expressed as R1. The surface roughness of the portion S2 other than the portion directly above all the electronic components on the upper surface of the insulating resin layer 8 is expressed as R2. At least one R1 satisfies the condition: R1>R2.

3 Claims, 3 Drawing Sheets

(58) Field of Classification Search
CPC . H05K 2201/1006; H05K 2201/10522; H05K 2201/10636; H05K 2201/10734; H01L 23/552; H01L 23/562; H01L 23/3121; H01L 2924/3025; H01L 23/295; H01L 24/16; H01L 2224/16227; H03H 9/02913; H01G 4/30; H01G 4/12; H01G 2/22
See application file for complete search history.

(56) References Cited

U.S. PATENT DOCUMENTS

| | | | |
|---|---|---|---|
| 6,762,921 B1 * | 7/2004 | Asai | H05K 3/4661 361/111 |
| 7,993,978 B2 | 8/2011 | Sato | |
| 8,922,024 B2 * | 12/2014 | Na | H01L 23/5226 257/773 |
| 10,811,352 B2 * | 10/2020 | Jeong | H01L 28/40 |
| 2001/0045638 A1 | 11/2001 | Ohgiyama et al. | |
| 2003/0015342 A1 | 1/2003 | Sakamoto et al. | |
| 2009/0291531 A1 * | 11/2009 | Sato | H01L 21/4878 425/464 |
| 2010/0083495 A1 | 4/2010 | Hirayama et al. | |
| 2010/0172116 A1 | 7/2010 | Yorta et al. | |
| 2010/0181688 A1 | 7/2010 | Yanagisawa et al. | |
| 2012/0292772 A1 | 11/2012 | Yorta et al. | |
| 2014/0182907 A1 * | 7/2014 | Lee | H01G 4/232 174/258 |
| 2014/0182911 A1 | 7/2014 | Lee et al. | |
| 2014/0284775 A1 | 9/2014 | Nomura | |
| 2014/0291825 A1 | 10/2014 | Yoneyama et al. | |
| 2015/0170988 A1 | 6/2015 | Watanabe et al. | |
| 2015/0382478 A1 * | 12/2015 | Shimada | H05K 1/185 216/13 |
| 2017/0004980 A1 | 1/2017 | Park et al. | |
| 2017/0025324 A1 | 1/2017 | Yamaki et al. | |
| 2017/0040112 A1 | 2/2017 | Tanaka et al. | |
| 2017/0047264 A1 * | 2/2017 | Im | H01L 23/36 |
| 2017/0257977 A1 | 9/2017 | Chainer et al. | |
| 2017/0294387 A1 | 10/2017 | Kawabata et al. | |
| 2019/0267330 A1 * | 8/2019 | Takizawa | H01G 2/22 |

FOREIGN PATENT DOCUMENTS

| | | |
|---|---|---|
| JP | 2010-114291 A | 5/2010 |
| JP | 2010-171107 A | 8/2010 |
| JP | 2014-209544 A | 11/2014 |

* cited by examiner

42a(42b)

42a(42b)

42a(42b)

42a(42b)

CIRCUIT MODULE

CROSS-REFERENCE TO RELATED APPLICATION

This is a Continuation of application Ser. No. 16/284,231 filed Feb. 25, 2019, which claims the benefit of Japanese Patent Application No. 2018-033425 filed Feb. 27, 2018. The disclosure of the prior applications is hereby incorporated by reference herein in its entirety.

TECHNICAL FIELD

The present invention relates to a circuit module.

BACKGROUND

There is known a circuit module equipped with a wiring structure, an electronic component arranged on the upper surface of the wiring structure, and an insulating resin layer in which the electronic component is embedded. As is known, a metal layer is provided on the upper surface of the insulating resin layer for electromagnetic shielding of the electronic component.

CITATION LIST

Patent Literature

[Patent Document 1] Japanese Unexamined Patent Publication No. 2010-114291

SUMMARY

There is a difference in CTE (coefficient of thermal expansion) between the electronic component and the insulating resin layer, so that when heat processing is performed on the circuit module, stress is generated in the circuit module. In the conventional circuit module, when stress is applied to the metal layer, the metal layer is likely to be separated from the insulating resin layer. In particular, when the metal layer situated directly above the electronic component is separated, the electromagnetic shielding effect is likely to be markedly deteriorated. Further, in the case where the metal layer is utilized as a wiring layer, the stray capacitance between the electronic component and the metal layer is changed, and the electrical characteristic in the high frequency range is allowed to be deviated with respect to the design intention.

The present invention has been made in view of the above problem in the prior art technique. It is an object of the present invention to provide a circuit module in which the metal layer situated directly above the electronic component is hard to separate.

According to an aspect of the present invention, there is provided a circuit module comprising: a wiring structure; at least one electronic component arranged on an upper surface of the wiring structure; an insulating resin layer which is provided on the upper surface of the wiring structure and in which at least one electronic component is embedded; and a metal layer provided on an upper surface of the insulating resin layer. When the surface roughness of the portion directly above each electronic component on the upper surface of the insulating resin layer is expressed as R1, and the surface roughness of the portion other than the portion directly above all the electronic components on the upper surface of the insulating resin layer is expressed as R2, at least one R1 satisfies the condition: R1>R2.

In the above circuit module, R1>R2, with the result that the adherence between the insulating resin layer and the metal layer on the portion directly above the electronic component is higher than the adherence between the insulating resin layer and the metal layer on the portion other than the portion directly above the electronic component. Thus, the metal layer on the portion directly above the electronic component is hard to separate. In the case where the metal layer is separated from the insulating resin layer through heat processing or the like, the metal layer on the portion other than the portion directly above the electronic component is first separated. After this, due to the presence of the portion where the metal layer has been separated, the stress applied to the metal layer is mitigated, and the metal layer on the portion directly above the electronic component becomes still harder to separate.

In a circuit module according to an aspect of the present invention, R1/R2 may range from 1.01 to 8.00. In this mode, the metal layer on the portion directly above the electronic component is still harder to separate.

In a circuit module according to an aspect of the present invention, at least a part of the upper surface of the electronic component may have a concave or a convex configuration. In this mode, the adherence between the insulating resin layer and the metal layer on the portion directly above the electronic component is likely to be still higher, with the result that the difference between the adherence between the insulating resin layer and the metal layer on the portion directly above the electronic component and the adherence between the insulating resin layer and the metal layer on the portion other than the portion directly above the electronic component is likely to become still larger. As a result, the metal layer on the portion directly above the electronic component is still harder to separate.

In accordance with the present invention, there is provided a circuit module in which the metal layer situated directly above the electronic component is hard to separate.

DETAILED DESCRIPTION

Figure 1:
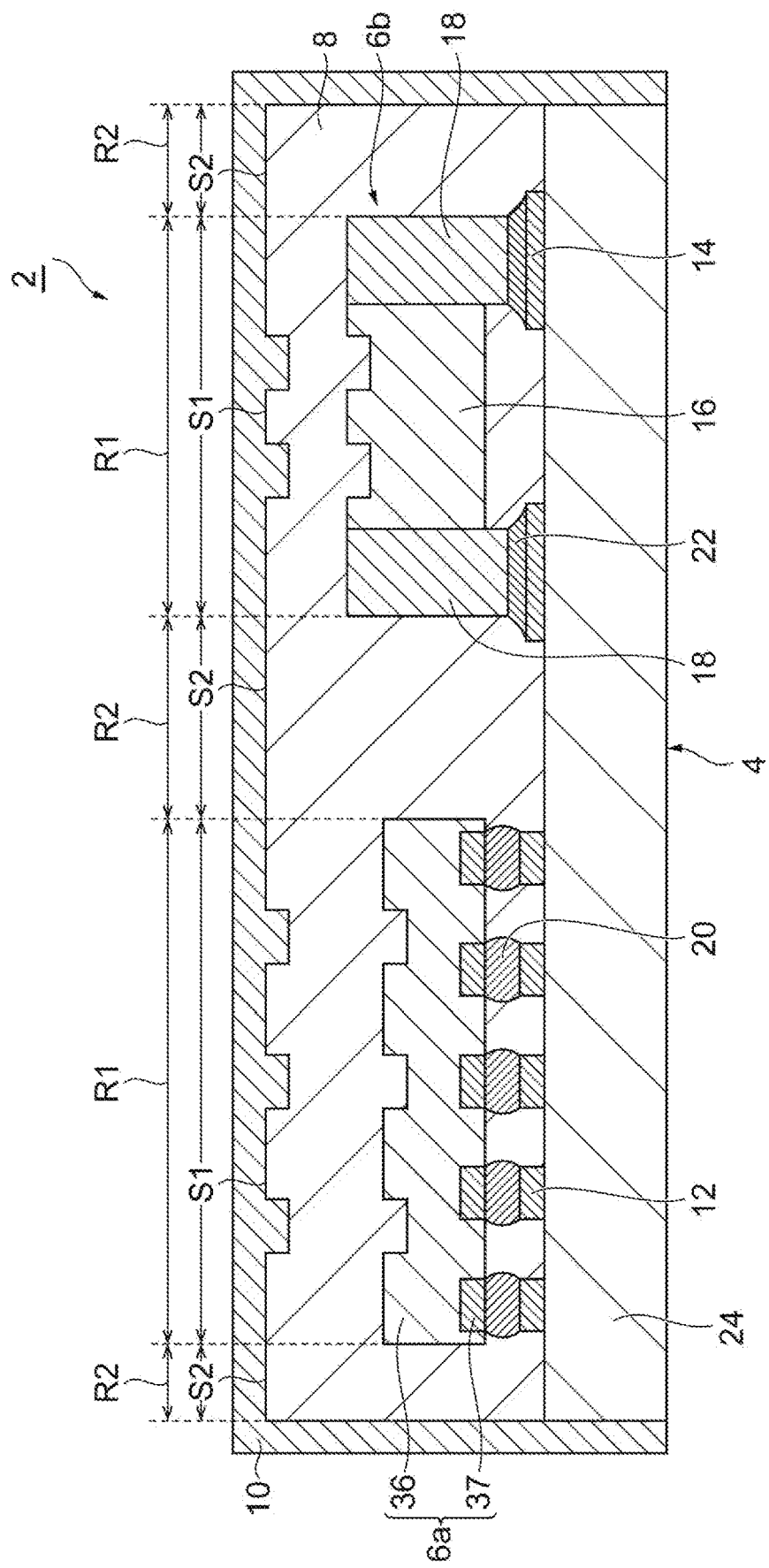
FIG. 1 is a sectional view of a circuit module according to an embodiment of the present invention.

In the following, preferred embodiments of the present invention will be described in detail. In the drawings, the same or equivalent components are designated by the same reference numerals. The upper limit value and the lower limit value of each value range given in the present specification allow arbitrary combination.

A circuit module 2 according to the present embodiment will be described with reference to FIG. 1. The circuit module 2 is equipped with a wiring structure 4, electronic components 6a and 6b, connection portions 20 and 22, an insulating resin layer 8, and a metal layer 10.

The wiring structure 4 has an insulating layer 24, and a plurality of wiring layers 12 and 14 provided on the upper surface of the insulating layer 24. The material of the insulating layer 24 may, for example, be resin, ceramic, or resin-impregnated glass fiber. The resin may be epoxy resin, polyimide or the like. The ceramic may be alumina or the like. The ceramic may be LTCC (low temperature co-fired ceramics), HTCC (high temperature co-fired ceramics) or the like. The resin-impregnated glass fiber may be CCL (copper clad laminate) or the like. The material of the wiring layers 12 and 14 may be copper (Cu), nickel (Ni) or the like.

The electronic component 6a is arranged on the upper surface of the wiring structure 4. The electronic component 6a is equipped with a main body portion 36, and a plurality of terminal portions 37 provided on the back surface of the main body portion 36. Although not shown, the main body portion 36 is provided with a device electrically connected to each terminal portion 37. At least a part of the upper surface of the electronic component 6a has unevenness.

The electronic component 6b is arranged on the upper surface of the wiring structure 4. The electronic component 6b is equipped with a main body portion 16, and a pair of terminal portions 18 respectively provided at both side end portions of the main body portion 16. Although not shown, the main body portion 16 is provided with a device electrically connected to each terminal portion 18. At least a part of the upper surface of the electronic component 6b has unevenness.

Devices of the electronic components 6a and 6b may, for example, be capacitors, inductors, resistors, semiconductors, or SAW (surface acoustic wave) filters. The capacitor may be a laminated ceramic capacitor (MLCC: multi-layer ceramic capacitor) or the like. The inductor may be formed of a material such as a resin type, an alumina type, a ferrite type, or a metal type material. The electronic components 6a and 6b may be integrated circuits (IC).

Each connection portion 20 electrically connects each terminal portion 37 of the electronic component 6a and each wiring layer 12 of the wiring structure 4. In the present embodiment, the connection portion 20 can be formed through reflow of solder bumps provided at the terminal portions 37 of the electronic component 6a. Each connection portion 22 electrically connects each terminal portion 18 of the electronic component 6b and each wiring layer 14 of the wiring structure 4. The connection portions 22 can be formed through reflow of printing solder provided on the terminal portion 18 of the electronic component 6b.

The insulating resin layer 8 is provided on the upper surface of the wiring structure 4. The electronic components 6a and 6b are embedded in the insulating resin layer 8. The insulating resin layer 8 is a layer including resin. The resin may be epoxy resin or the like. The insulating resin layer 8 may consist solely of resin, or may include some other ingredient in addition to the resin. The insulating resin layer 8 may include, for example, filler.

The upper surface of the insulating resin layer 8 has unevenness. The configuration of the unevenness that the upper surface of the insulating resin layer 8 has may correspond to the configuration of the unevenness that the upper surface of the electronic components 6a and 6b has.

Here, the upper surface of the insulating resin layer 8 is classified into a portion S1 directly above the electronic component 6a or 6b and a portion S2 other than all the portions directly above the electronic components (the portion not directly above any electronic component). The surface roughness of each portion S1 is expressed as R1, and the surface roughness of the portion S2 is expressed as R2.

In the circuit module 2 of the present embodiment, the surface roughness R1 of at least one of the portions S1 directly above electronic component is larger than the surface roughness R2 of the portion S2 that is not directly above the electronic component. In other words, at least one R1 satisfies the condition: R1>R2.

In the case where there are a plurality of electronic components, it is only necessary for the surface roughness R1 of the portion S1 directly above at least one electronic component to be larger than the surface roughness R2. However, the surface roughness R1 of each of the portions S1 directly above a plurality of electronic components may be larger than R2.

Here, the surface roughness means the arithmetic average roughness Ra as specified in JIS B 0601:2013.

R1/R2 may range, for example, from 1.01 to 8.00, or from 1.03 to 2.00. In the case where R1/R2 is within the above range, the metal layer 10 on the portion S1 directly above the electronic component is still harder to separate.

R1 may range, for example, from 0.23 to 2.3 μm. R2 may range, for example, from 0.05 to 1.5 μm. The surface roughness can be measured by using, for example, a configuration measurement laser microscope manufactured by KEYENCE Co., Ltd. (model: VK-X200). The lens magnification employed at this time may be ×20 or ×50. The measurement field of view may range, for example, from 150 μm×150 μm to 700 μm×500 μm. At the time of measurement, it is possible to provide, with respect to the measurement specimen, a cutoff wavelength λc distinguishing between surface roughness and warpage. λc may range from 50 to 300 μm.

The metal layer 10 is provided on the upper surface of the insulating resin layer 8. The metal layer 10 may be also provided on the side surface of the insulating resin layer 8 and on the side surface of the wiring structure 4. The metal layer 10 functions as the electromagnetic shield or the wiring of the electronic component device. The metal layer 10 is a layer including a metal. There are no particular limitations regarding as the material of the metal layer 10 so long as it is a material of the electromagnetic shield or the wiring. The material of the metal layer 10 may, for example, be a material containing a conductive element such as Cu, Ni, Fe, Cr, Co, Al, or Ag or a magnetic element. The metal layer 10 may assume various modes such as a single layer, a multi-layer, and a composite with resin.

The circuit module 2 according to the present embodiment can be produced, for example, by the following method. The method of producing the circuit module 2, however, is not restricted to the following one.

Figure 2A:
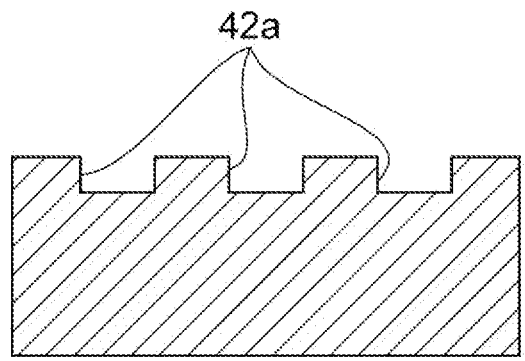
FIGS. 2A and 2B are sectional views of electronic components.
Figure 2B:
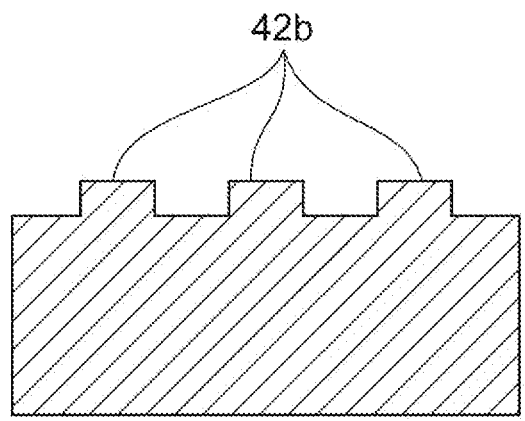
Figure 3A:
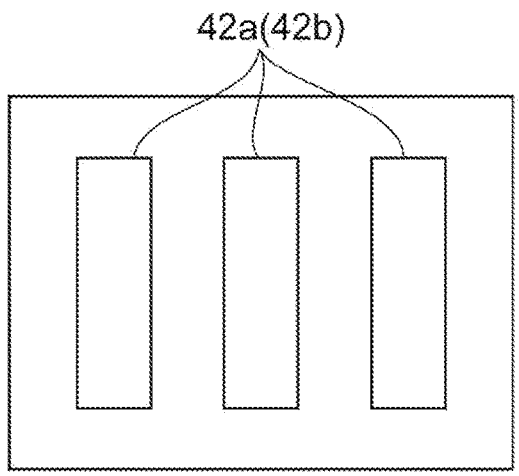
FIGS. 3A to 3D are plan views of the electronic components.
Figure 3B:
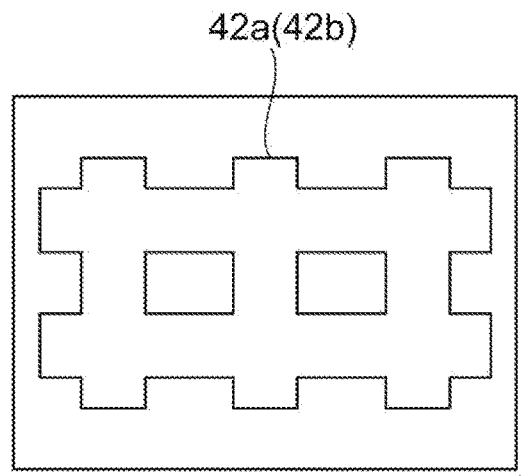
Figure 3C:
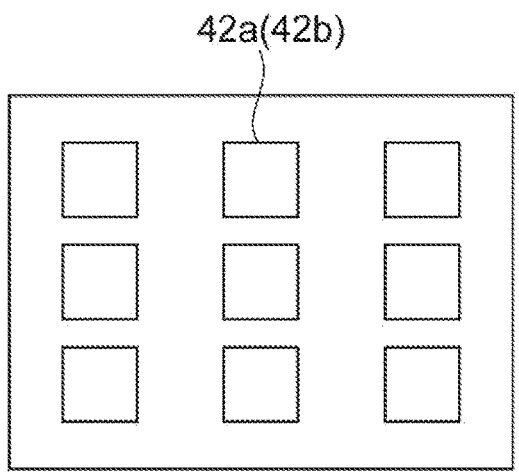
Figure 3D:
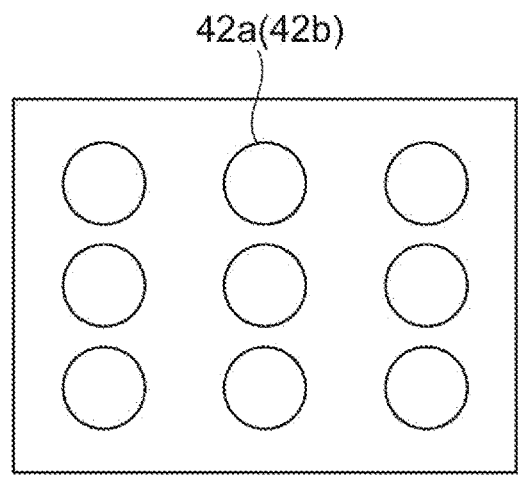

First, there are prepared the wiring structure 4, and the electronic components 6a and 6b having unevenness on the upper surface thereof. Unevenness may be provided on the upper surface of electronic components to form the electronic components 6a and 6b having unevenness on the upper surface thereof. In this case, the unevenness can be formed, for example, by the following method. For example, the unevenness may be formed through scanning of the upper surface of the electronic component by using a laser beam machine, with the laser beam being defocused. The unevenness may be transferred at the time of the molding of the electronic component. The unevenness pattern may be formed on the electronic component by utilizing photolithography. The unevenness may be formed by adjusting the grain size of the material constituting the electronic component, and leaving the grain unevenness on the surface of the electronic component. FIGS. 2A and 2B are sectional views of the electronic components. The unevenness may be of a concave configuration as shown in FIG. 2A, or of a convex configuration as shown in FIG. 2B. In other words, on the upper surface of the electronic component, there may be formed recesses 42a as shown in FIG. 2A, or protrusions 42b as shown in FIG. 2B. FIGS. 3A to 3D are plan views of the electronic components. As shown in FIG. 3A, the unevenness may be strip-like recesses 42a or protrusions 42b extending in one direction. As shown in FIG. 3B, the unevenness may be strip-like recesses 42a or protrusions 42b extending in two directions. As shown in FIG. 3C, the unevenness may be rectangular recesses 42a or protrusions 42b. As shown in FIG. 3D, the unevenness may be round recesses 42a or protrusions 42b. Although not shown, it is only necessary for the size, interval, etc. of this unevenness to be in a range allowing formation on the electronic components 6a and 6b. They may be regular unevenness, or irregular unevenness. While in FIGS. 2A and 2B the inner surface of the recesses and the outer surface of the protrusions are perpendicular or parallel to the upper surface of the electronic component, they may also be inclined with respect thereto. The inner surface of the recesses and the outer surface of the protrusions may be flat surfaces or curved surfaces.

Next, by the well-known reflow method or the like, the wiring layer of the wiring structure 4 and the terminal portions of the electronic components 6a and 6b are connected via the connection portions 20 and 22. After this, the insulating resin layer 8 is formed on the upper surface of the wiring structure 4 to seal the electronic components 6a and 6b. When the insulating resin layer 8 is formed, the insulating resin layer 8 undergoes deformation along the configuration of the unevenness on the upper surface of the electronic component 6a, 6b, whereby there are formed on the upper surface of the insulating resin layer 8 unevenness corresponding to the unevenness on the upper surface of the electronic component 6a, 6b. The method of forming the insulating resin layer 8 may, for example, be transfer molding, compression molding, printing, laminating, or casting. From the viewpoint of efficiently forming the unevenness on the surface of the insulating resin layer 8, it is desirable for the method of forming the insulating resin layer 8 to be compression molding.

After this, the metal layer 10 is formed on the upper surface and the side surface of the insulating resin layer 8. The method of forming the metal layer 10 may be plating, sputtering or the like.

In the circuit module 2 of the present embodiment, the surface roughness R1 of at least one of the portions S1 directly above the electronic component on the upper surface of the insulating resin layer 8 is larger than the surface roughness R2 of the portion S2 that is not directly above the electronic components. As a result, the adherence between the insulating resin layer 8 and the metal layer 10 at the portion S1 directly above the electronic component is higher than the adherence between the insulating resin layer 8 and the metal layer 10 at the portion S2 that is not directly above the electronic component. Thus, the metal layer 10 at the portion S1 directly above the electronic component is hard to separate. In the case where the metal layer 10 is separated from the insulating resin layer 8 by the thermal stress due to heat processing or the like, the metal layer 10 at the portion S2 that is not directly above the electronic component is first separated. After this, due to the presence of the portion where the metal layer 10 has been separated, the stress applied to the metal layer 10 is mitigated, and the metal layer 10 at the portion S1 directly above the electronic component becomes still harder to separate. In this way, even if in advertent separation is generated in the metal layer 10, separation of the metal layer 10 at the portion S1 directly above the electronic component is suppressed, whereby it is possible to minimize the influence on the electrical characteristics of the circuit module 2.

The present invention is not restricted to the embodiment thereof described in detail above.

For example, in the circuit module 2, a wiring layer may be further provided on the lower surface of an insulating layer 24 that the wiring structure 4 has. The wiring layer may be further provided in the insulating layer 24. The wiring structure 4 may be a single layer or a multi-layer substrate (build-up substrate). The wiring structure 4 may be further equipped with an insulating covering layer provided on the upper surface of the insulating layer 24. The insulating covering layer may cover a part of the wiring layers 12 and 14. The insulating covering layer may be a solder resist layer or the like.

While in the circuit module 2 the number of electronic components is two, at least one electronic component suffices, and the number may be one or three or more. There are no particular restrictions regarding the size and configuration of the electronic components. Nor are there any particular restrictions regarding the number of terminal portions of the electronic components, the number of wiring layers of the wiring structure, and the number of connection portions.

While in the circuit module 2 there are provided unevenness on the upper surface of the electronic component 6a, unevenness may be further provided on the lower surface or the side surface of the electronic component 6a, or unevenness may be provided on the entire surface of the electronic component 6a. Further, while unevenness is provided on the upper surface of the main body portion 16 of the electronic component 6b, unevenness may be further provided on the lower surface of the main body portion 16, the upper surface of each terminal portion 18, or the side surface of each terminal portion 18, or unevenness may be provided on the entire surface of the electronic component 6b.

When sealing the electronic component 6a, 6b with the insulating resin layer 8, there are formed, on the upper surface of the insulating resin layer 8, unevenness corresponding to the unevenness on the upper surface of the electronic component 6a, 6b. After this, different unevenness may be further provided on the upper surface of the insulating resin layer 8. The insulating resin layer 8 may have unevenness on the side surface in addition to those on the upper surface.

Even in the case where the electronic component 6a, 6b has no unevenness on the upper surface thereof, the present invention can be carried out. In this case, on the surface of the mold for forming the insulating resin layer 8, there are previously provided unevenness at a position that is directly above the electronic component. Then, it is possible to form unevenness on the portion S1 on the upper surface of the insulating resin layer 8. Further, by scanning the upper surface of the insulating resin layer 8 by using a laser beam machine, with the laser beam being defocused, it is possible to form unevenness while roughening the upper surface of the insulating resin layer 8.

While in the circuit module 2 the metal layer 10 is provided on the upper surface and the side surface of the insulating resin layer 8 and on the side surface of the wiring structure 4, it is only necessary for the metal layer to be provided at least on the upper surface of the insulating resin layer 8.

REFERENCE SIGNS LIST

2 . . . circuit module, 4 . . . wiring structure, 6a, 6b . . . electronic component, 8 . . . insulating resin layer, 10 . . .

metal layer, 12, 14 . . . wiring layer, 16, 36 . . . main body portion, 18, 37 . . . terminal portion, 20, 22 . . . connection portion, 24 . . . insulating layer.

What is claimed is:

1. A circuit module comprising:
 a wiring structure;
 at least one electronic component arranged on an upper surface of the wiring structure;
 an insulating resin layer provided on the upper surface of the wiring structure and in which the at least one electronic component is embedded; and
 a metal layer provided on an upper surface of the insulating resin layer,
 wherein when a surface roughness of a portion directly above the at least one electronic component on the upper surface of the insulating resin layer is expressed as R1, and a surface roughness of a portion other than the portion directly above the at least one electronic component on the upper surface of the insulating resin layer is expressed as R2, at least one R1 satisfies the condition: R1>R2,
 when a surface roughness of a portion directly above the at least one electronic component on an upper surface of the metal layer is expressed as R3, at least one R1 and R3 satisfy the condition: R1>R3, and
 at least a part of an upper surface of the at least one electronic component has a concave or a convex configuration, and
 the upper surface of the insulating resin layer above the at least one electronic component and the upper surface of the at least one electronic component has a same shape.

2. The circuit module according to claim 1, wherein R1/R2 ranges from 1.01 to 8.00.

3. The circuit module according to claim 1, wherein the portion directly above the at least one electronic component on the upper surface of the metal layer is flat.

* * * * *